United States Patent [19]
Bostick et al.

[11] Patent Number: 5,983,438
[45] Date of Patent: Nov. 16, 1999

[54] SPUTTER LOAD LOCK O-RING CLEANER

[75] Inventors: Kenneth Mark Bostick, San Antonio; William Joseph Dalton, Sutherland Springs, both of Tex.

[73] Assignees: Sony Corporation, Tokyo, Japan; Sony Electronics, Inc., Park Ridge, N.J.

[21] Appl. No.: 09/042,041

[22] Filed: Mar. 13, 1998

[51] Int. Cl.[6] .................................................. B08B 9/087
[52] U.S. Cl. .......................................... 15/246.5; 15/246
[58] Field of Search ................... 15/246, 246.5, 15/104.095

[56] References Cited

U.S. PATENT DOCUMENTS

| 2,195,344 | 3/1940 | Slaugenhop | 15/246.5 |
| 4,962,566 | 10/1990 | Gemma | 15/246 |
| 5,109,562 | 5/1992 | Albrecht | 15/246 |

FOREIGN PATENT DOCUMENTS

| 1434235 | 5/1976 | United Kingdom | 15/246.5 |

Primary Examiner—Randall E. Chin
Attorney, Agent, or Firm—Ronald P. Kananen; Rader, Fishman & Grauer

[57] ABSTRACT

A cleaning apparatus and method for removing debris from the seals of a pressurized enclosure, specifically a sputter load lock chamber. The cleaning apparatus includes a load lock replacement door, a cleaning tool, and a seal. The load lock replacement door includes a surface that seals the opening of the load lock chamber so as to maintain a desired vacuum pressure in the load lock chamber. The sealing surface supports a cleaning tool. The cleaning tool and the sealing surface are supported by a vacuum seal which limits leakage of gas at ambient conditions into the load lock chamber. Once the tool is installed, the load lock chamber is pumped-down to a desired vacuum pressure. The tool is manipulated as necessary to remove debris from the seals of the load lock chamber. Once the cleaning process has been completed, the load lock chamber is vented, the tool removed, and the load lock door closed and sealed. The load lock chamber is restored to the desired operating vacuum pressure and the machine is placed back on-line.

10 Claims, 1 Drawing Sheet

SPUTTER LOAD LOCK O-RING CLEANER

FIELD OF THE INVENTION

The present invention relates generally to an apparatus and method for cleaning the O-ring seals of a sputter load lock system. More particularly, the invention relates to a cleaning apparatus having a surface for sealing the entrance to a pressurized enclosure, a cleaning tool supported by the surface and a seal surrounding the cleaning tool.

BACKGROUND OF THE INVENTION

Conventional load lock vacuum sputtering systems generally include a vacuum sputtering chamber and a load lock chamber. The vacuum sputtering chamber is where the actual sputtering process takes place. The load lock chamber is the area where the workpiece is transferred from atmospheric conditions to the vacuum sputtering chamber. Consequently, the load lock chamber is continuously exposed to vacuum and atmospheric pressures. The load lock chamber therefore must be properly sealed to maintain the desired vacuum pressure once sealed and to prevent gas at ambient pressure from leaking into the vacuum sputtering chamber.

Occasionally, debris accumulates on the load lock chamber seals causing the seals to leak, resulting in a pressure increase inside the load lock chamber. Minor leaks between the load lock and sputtering chamber are controlled through a double O-ring sealed area connected to a mechanical pump. However, this problem may become severe enough to cause a corresponding gas leak and an associated pressure increase in the mechanical pump line or the vacuum sputtering chamber. To correct the leakage problem, the debris must be removed from the seals. Conventional means to fix the leak, the vacuum sputtering chamber must be vented and exposed to atmospheric conditions.

If the vacuum sputtering chamber experiences a pressure increase, it may require venting and re-pressurization. This procedure entails a significant amount of machine downtime due to the time required to pump-down the vacuum sputtering chamber to the required operating pressure. A typical vacuum sputtering chamber may have a volume of approximately seven cubic feet and operate at about $5.0 \times 10^{-7}$ Torr. It generally takes approximately eight to twenty-four hours to restore a vacuum sputtering chamber of this size to the desired operating conditions once the load lock chamber has been exposed to atmospheric pressure. A system for cleaning debris from load lock chamber seals is needed that would allow the cleaning process to take place under vacuum pressure, thus reducing the likelihood of having to vent the vacuum sputtering chamber except in the most extreme circumstances.

SUMMARY OF THE INVENTION

The present invention is directed to a cleaning apparatus and method for removing debris from the seals of a pressurized enclosure. The apparatus includes a load lock replacement door, a cleaning tool, and a seal.

The load lock replacement door includes a surface for sealing the entrance to a pressurized enclosure, such as a sputter load lock chamber, so as to maintain the desired operating pressure of the enclosure.

The cleaning tool is supported by the sealing surface of the load lock door, and includes a proximate and a distal end. The distal end supports a cleaning head and the proximal end may support a rotary knob used to reposition the tool during the cleaning process. The cleaning head may be any device suitable for removing debris from the load lock chamber seals. For example, the cleaning head may comprise a brush, a suction device, or any similar apparatus. Additionally, the cleaning tool may include a moveable shaft which supports the cleaning head. The cleaning tool may be supported by a moveable surface carried by the load lock door. The moveable surface may include a collapsible bellows that imparts reciprocal motion to the moveable surface and, thus, the cleaning tool.

The seal surrounds the cleaning tool, limiting leakage across the tool and into the enclosure. The seal may include a rotary vacuum seal such as a ferrofluid seal contained by an enclosed housing.

To install the cleaning tool over the opening to the load lock chamber, the load lock chamber must be vented to increase the pressure therein so that the load lock door can be opened. Once the door is opened, the load lock chamber is exposed to ambient conditions. To prevent exposure of the vacuum sputtering chamber to atmospheric conditions, a ram load lock door, a surface separating the vacuum sputtering chamber from the load lock chamber, and a transfer plate, a moveable surface that transfers a workpiece from the load lock chamber to the vacuum sputtering chamber, form a positive seal with the wall of the load lock chamber by compressing O-rings carried by the ram load lock door and the load lock chamber wall. The sealing surface is placed over the entrance to the load lock chamber, and the load lock chamber is evacuated from atmospheric pressure down to a desired vacuum pressure. The ram load lock door and the transfer plate release the seal with the load lock chamber, exposing the load lock chamber seal to be cleaned. The tool may be manipulated—rotated or moved axially or laterally—as necessary to remove the debris from the seals. Once the cleaning process has been completed, the load lock chamber is once again vented to increase the pressure therein, and the apparatus is removed. The load lock door is closed and the load lock chamber pumped-down to the desired operating pressure.

BRIEF DESCRIPTION OF THE DRAWING

The features and inventive aspect of the present invention will become more apparent upon reading the following detailed description, claims and drawing, of which the following is a brief description:

DESCRIPTION OF A PREFERRED EMBODIMENT

Figure 1:
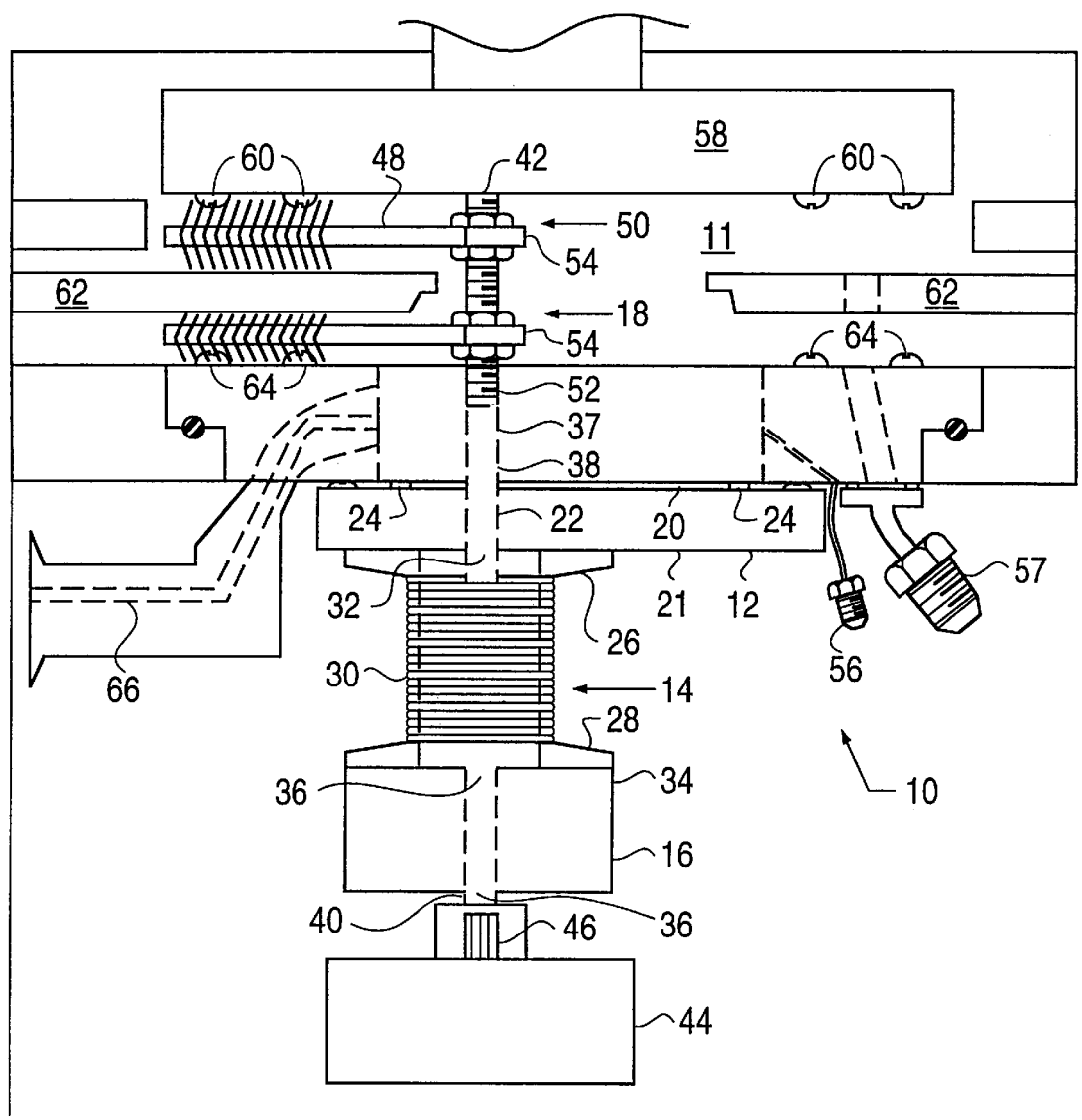
FIG. 1 is a side cross-sectional view showing a cleaning apparatus formed in accordance with the teachings of the present invention mounted over the entrance of a sputter load lock chamber.

FIG. 1 shows a preferred embodiment of a sputter load lock O-ring cleaning apparatus 10. Constituent components of the apparatus 10 include a load lock replacement door 12, a moveable surface 14, a seal 16, and a cleaning tool 18.

The load lock replacement door 12 includes an opening 22 and a first surface 20 for sealing the entrance to a pressurized enclosure such as a load lock chamber 11 and a second surface 21. The surfaces 20, 21 may be formed in various configurations using a variety of materials that are commonly known in the art. The surface 20 may be held in position over the load lock chamber 11 entrance by alignment pins 24 carried by surface 20 and received in openings formed by the load lock chamber 11 wall. The surface 20 forms a vacuum seal with the entrance to the load lock chamber 11, permitting the load lock chamber 11 to be pumped-down and held at a predetermined vacuum pressure during the cleaning process. The vacuum seal may be formed using O-ring seals or other similar devices that may bridge the junction between the surface 20 and the mating wall of load lock chamber 11 to limit gas leaks across the junction.

The moveable surface 14 includes a first surface 26 and a second surface 28 separated by a moveable wall 30. The moveable wall 30 may be integrally formed with the surfaces 26, 28. However, the moveable wall 30 may be separately formed and detachably or permanently secured to each of the surfaces 26, 28. If the moveable wall 30 is separately formed, the joint between the surfaces 26, 28 and the moveable wall 30 must be vacuum sealed to prevent gas from seeping across the joint and into load lock chamber 11. The moveable wall 30 may include a collapsible bellows that permits the moveable surface 14 to move with a reciprocating motion.

The moveable surface 14 also defines an opening 32 that extends through the first surface 26, the second surface 28, and the moveable wall 30. The surfaces 26, 28 and the moveable wall 30 may be manufactured of stainless steel or any other material having similar mechanical properties.

As shown in FIG. 1, the surface 26 is carried by the surface 21 of the door 12. The surface 26 is positioned off-center on the surface 21 and may be welded in place or detachably secured to the surface 21 using O-ring clamps or other similar devices known in the art. A detachable mounting facilitates maintenance of the moveable surface 14 should any of its seals or components require replacement or repair. The joint between the surface 26 and the surface 21 must be properly sealed to prevent gas at ambient pressure from leaking across the joint and into the load lock chamber 11.

The seal 16 forms a vacuum seal around the moveable surface 14, preventing air or other gases at ambient pressure from seeping into the apparatus 10, where it may be drawn into the load lock chamber 11. The seal 16 may be formed using O-ring seals or other similar devices known to those skilled in the art. For example, the seal 16 may be a rotary vacuum seal such as a dynamic O-ring seal, face seals, or other similar devices. In a preferred embodiment, the seal 16 is a ferrofluid seal. The fluid creates a positive seal by maintaining a continuous fluid path between rotating and non-rotating parts. An enclosed housing 34 retains the fluid. The enclosed housing 34 defines openings 36 in two opposing surfaces. The openings 36 are vacuum sealed to prevent gas from leaking into enclosed housing 34. The surface 28 of the moveable surface 14 supports the enclosed housing 34, and the enclosed housing 34 may be permanently or detachably affixed to the surface 28. Again, the junction between the enclosed housing 34 and the surface 28 must be vacuum sealed to limit gas leaks across the joint. The seal may be formed using O-ring seals or other similar devices.

The cleaning tool 18 includes a shaft 38. The shaft 38 includes an elongated body 37 received by the openings 22, 32, and 36 of the load lock replacement door 12, the moveable surface 14 and the seal 16, respectively. The shaft 38 also includes a proximate end 40 and a distal end 42. The proximate end 40 supports a moveable knob 44 used to reposition the tool 18 as needed during the cleaning process. For example, the tool 18 and the shaft 38 may be rotatable and capable of reciprocal motion. As illustrated in FIG. 1, a spline 46 secures the proximate end 40 to the knob 44. The distal end 42 supports an elongated member 48 having a cleaning head 50 attached thereto. The cleaning head may include bristle brushes or any other similar device suitable for cleaning debris from the load lock chamber 11 seals. The elongated member 48 may be secured to the distal end 42 using a threaded fastener 54 as illustrated in FIG. 1. As shown in FIG. 1, the distal end 42 defines screw threads 52. A nut 54 is placed onto the threaded end. Next, the elongated member 48 is placed onto the threaded end, and a second nut 54 is placed on the threaded end, securing the elongated member 48 in position. The shaft 38 supports the elongated member 48 in a manner that imparts reciprocal and rotary motion to the elongated member 48.

ASSEMBLY AND OPERATION

The load lock chamber 11 is vacuum sealed. In order to open the load lock door, the load lock chamber 11 must be vented through vent line 56. In a preferred embodiment, nitrogen is vented into the load lock chamber 11 in order to increase the pressure therein to permit opening of the load lock door. Once the pressure in the load lock chamber 11 increases to a level equal to atmosphere, the load lock door can be opened. To prevent a corresponding pressure increase in the vacuum sputtering chamber, a positive seal is created between the sputter vacuum chamber and the load lock chamber 11 by a ram load lock door 58, a moveable surface that separates the load lock chamber 11 from the sputtering chamber.

The ram load lock door 58 includes O-ring seals 60 that extend around the circumference thereof. When the ram load lock door 58 is opened, the ram load lock door 58 moves forward. The O-ring seal 60 compresses against a transfer plate 62, a surface used to transfer the workpiece between the load lock chamber 11 and the vacuum sputtering chamber, causing the transfer plate 62 to move forward and compress the O-ring seal 64 carried by the load lock chamber 11 wall. This sealing arrangement positively seals the vacuum sputtering chamber from the atmospheric conditions present at the load lock chamber 11. To allow for only minor leaks across these O-ring seals 60 and 64, a mechanical vacuum pump connects to and pumps through a pump line 57. When the ram load lock door 58 and the transfer plate 62 move forward, the moveable surface 14 compresses, retracting the tool 18 and shaft 38.

Once the load lock door is opened, the cleaning apparatus 10 seals the entrance to load lock chamber 11 by closing the entrance with the surface 20. Next, the differential pump-out line 66 pumps the load lock chamber 11 down to a predetermined vacuum pressure. At this predetermined pressure, the ram load lock door 58 and the transfer plate 62 retract, exposing the O-ring seals 60, 64. Once the seals 60, 64 are exposed, the cleaning tool 18 may be manipulated as necessary to remove debris from the O-ring seals 60, 64. The tool 18 may be capable of rotational, axial and lateral movement. In order to facilitate cleaning the complete surface of the O-ring seals 60, 64, the position of the cleaning tool 18 may be varied by rotating the load lock replacement door 12 in increments of approximately 30 degrees and repeating the sealing process describe above.

To remove the cleaning tool 18, the tool 18 is rotated to a position previously marked on the rotary knob 44 and the enclosed housing 34. Rotating the tool 18 to this predetermined position will prevent the tool 18 from interfering with the proper movement and operation of the load lock ram 58 and the transfer plate movement 62. The ram load lock door 58 and the transfer plate 62 move forward as described above to positively seal-off the vacuum sputtering chamber from the load lock chamber 11, and the moveable surface 14 contracts, retracting the tool 18. The load lock chamber 11 is vented to increase the pressure therein. The load lock replacement door 12 is removed and detached from the sputtering system. The load lock door is again activated and is placed over the entrance to the load lock chamber 11. Once the load lock door is closed, the differential pump evacuates the load lock chamber 11 through the differential pump-out line 57 from atmospheric pressure to a predetermined vacuum pressure. At this predetermined pressure, the ram load lock door 58 and the transfer plate 62 retract as describe above.

There are a variety of configurations which may be employed to fabricate apparatus 10. For example, the apparatus 10 may include only surface 20, cleaning tool 18, and seal 16, wherein surface 20 directly supports the cleaning tool 18 and the seal 16 surrounds the cleaning tool 18, creating a vacuum seal between the tool 18 and surface 20. Thus, the disclosed embodiment is given to illustrate the invention. However, it is not intended to limit the scope and spirit of the invention. Therefore, the invention should be limited only by the appended claims.

We claim:

1. An apparatus for cleaning the seals of a pressurized enclosure comprising:

a surface for sealing an entrance to a pressurized enclosure so as to maintain the pressure of the enclosure;

a cleaning tool supported by the surface;

a seal surrounding the cleaning tool, limiting leakage across the tool and into the enclosure, wherein the seal is a rotary vacuum seal.

2. An apparatus as defined in claim 1, wherein the tool is moveable.

3. The apparatus as defined in claim 1, wherein the cleaning tool includes brushes attached to its distal end.

4. The apparatus as defined in claim 1, wherein the rotary vacuum seal is a ferrofluid seal.

5. The apparatus as defined in claim 1, wherein the cleaning tool is supported by a knob for repositioning the tool.

6. An apparatus for cleaning the seals of a pressurized enclosure comprising:

a cleaning tool including a shaft having a cleaning head attached to the distal end thereof;

a sealing surface for sealing an entrance to the enclosure so as to maintain a pressure within the enclosure, the surface defining an opening therein for receiving the shaft of said cleaning tool;

a moveable surface carried by the sealing surface, the moveable surface defining an opening therein for receiving the shaft of said cleaning tool; and a seal supported by the moveable surface and surrounding the shaft to limit leakage through the moveable surface;

wherein the cleaning head includes bristle brushes attached thereto.

7. An apparatus for cleaning the seals of a pressurized enclosure comprising:

a cleaning tool including a shaft having a cleaning head attached to the distal end thereof;

a sealing surface for sealing an entrance to the enclosure so as to maintain a pressure within the enclosure, the surface defining an opening therein for receiving the shaft of said cleaning tool;

a moveable surface carried by the sealing surface, the moveable surface defining an opening therein for receiving the shaft of said cleaning tool; and a seal supported by the moveable surface and surrounding the shaft to limit leakage through the moveable surface;

wherein the moveable surface is a collapsible bellows.

8. An apparatus for cleaning the seals of a pressurized enclosure comprising:

a cleaning tool including a shaft having a cleaning head attached to the distal end thereof;

a sealing surface for sealing an entrance to the enclosure so as to maintain a pressure within the enclosure, the surface defining an opening therein for receiving the shaft of said cleaning tool;

a moveable surface carried by the sealing surface, the moveable surface defining an opening therein for receiving the shaft of said cleaning tool; and a seal supported by the moveable surface and surrounding the shaft to limit leakage through the moveable surface;

wherein the seal is a rotary vacuum seal.

9. The apparatus as defined in claim 8, wherein the rotary vacuum seal is a ferrofluid seal.

10. An apparatus for cleaning the seals of a pressurized enclosure comprising:

a shaft having bristle brushes attached to its distal end for cleaning the seals of a pressurized enclosure;

a surface for sealing the entrance to the enclosure such that the surface maintains the pressure of the enclosure, the surface defining an opening therein for receiving the shaft;

a collapsible bellows carried by the opposite side of the sealing surface, said bellows defining an opening therein for receiving the shaft;

a rotary ferrofluid seal supported by the collapsible bellows, the ferrofluid seal being contained by an enclosed housing, said enclosed housing defining an opening in each of two opposing surfaces for receiving the shaft;

a rotary knob carried by the enclosed housing, the knob supporting the proximate end of the shaft.

* * * * *